United States Patent [19]
Kondo

[11] Patent Number: 4,549,198

[45] Date of Patent: Oct. 22, 1985

[54] SEMICONDUCTOR DEVICE

[75] Inventor: Takeo Kondo, Yokosuka, Japan

[73] Assignee: Tokyo Shibaura Denki Kabushiki Kaisha, Kawasaki, Japan

[21] Appl. No.: 645,534

[22] Filed: Aug. 29, 1984

Related U.S. Application Data

[63] Continuation of Ser. No. 324,631, Nov. 24, 1981.

[30] Foreign Application Priority Data

Nov. 29, 1980 [JP] Japan ................ 55-168581

[51] Int. Cl.$^4$ ................ H01L 27/02; H01L 29/78
[52] U.S. Cl. .................... 357/42; 357/23.11
[58] Field of Search ............... 357/23 CS, 42

[56] References Cited

U.S. PATENT DOCUMENTS

| | | | |
|---|---|---|---|
| 3,751,722 | 8/1973 | Richman | 357/23 CS |
| 4,013,484 | 3/1977 | Boleky et al. | 357/42 |
| 4,027,380 | 6/1977 | Deal et al. | 357/42 |
| 4,045,250 | 8/1977 | Dingwall | 357/42 |
| 4,135,955 | 1/1979 | Gasner et al. | 357/42 |
| 4,306,916 | 12/1981 | Wollesen et al. | 357/42 |

OTHER PUBLICATIONS

Baptiste et al., "High-Density Hermetically Sealed COS/MOS LSI Arrays" 8081 Proceedings of the Net. Electr. Conf., (1975), vol. 30, pp. 342–347.

Primary Examiner—Gene M. Munson
Attorney, Agent, or Firm—Finnegan, Henderson, Farabow, Garrett & Dunner

[57] ABSTRACT

A semiconductor device comprises a semiconductor substrate of N conductivity, a semiconductor well of P conductivity type, a first semiconductor region of P conductivity type formed in the substrate, the first semiconductor region forming a source region or a drain region in a first MOS transistor of P channel type, a second semiconductor region of N conductivity type formed in the well, the second semiconductor region forming a source region or a drain region in a second MOS transistor of N channel type, and a third semiconductor region of P conductivity type for partially covering the peripheral and bottom surfaces of said second region, which are in the proximity of a boundary defined between the substrate and the well, the third semiconductor region having an impurity concentration higher than that of the well.

2 Claims, 23 Drawing Figures

F I G. 3P
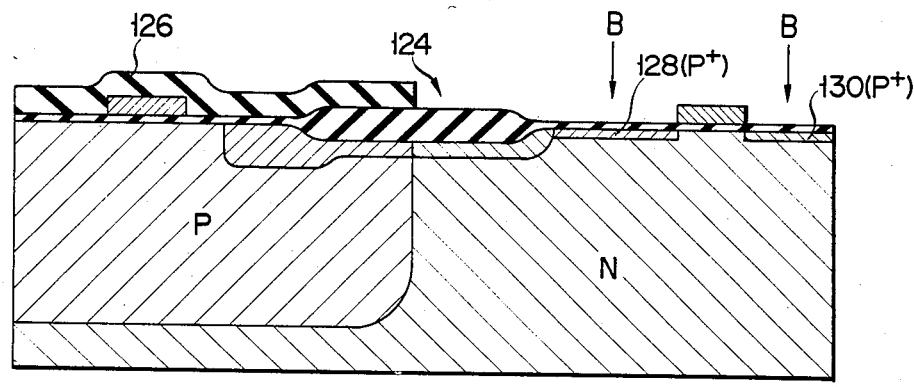
F I G. 3Q
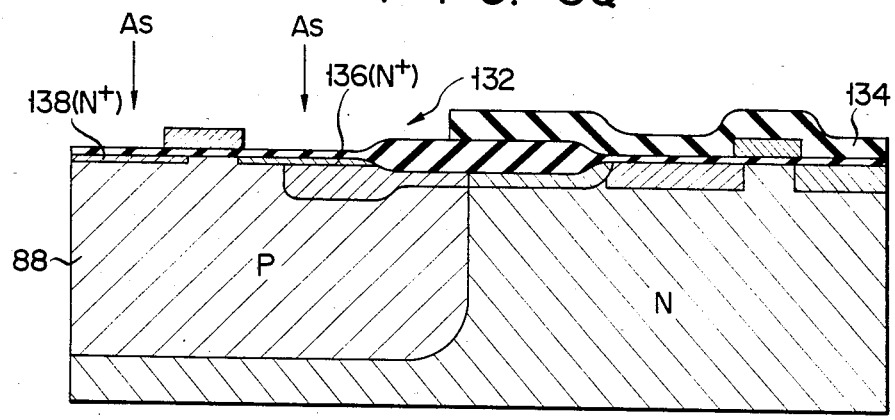
F I G. 3R
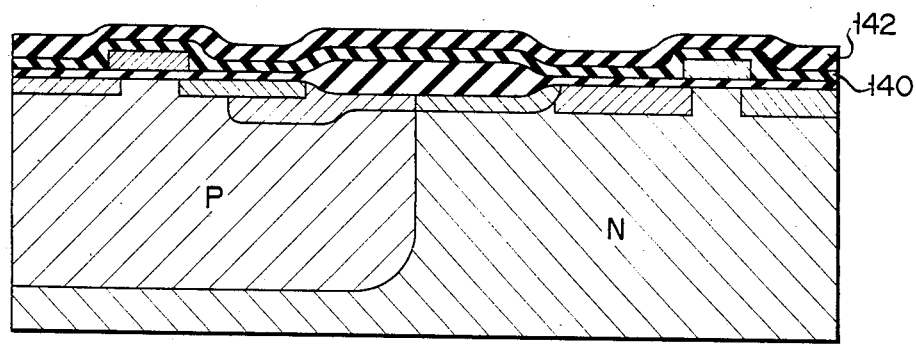

F I G. 3S
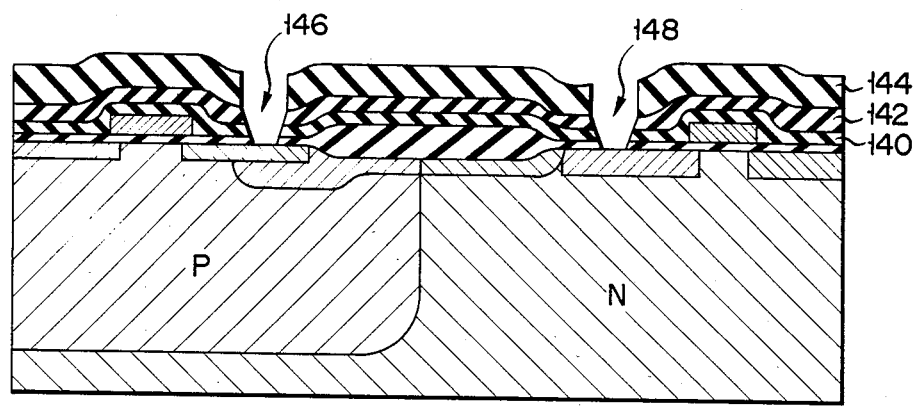
F I G. 3T
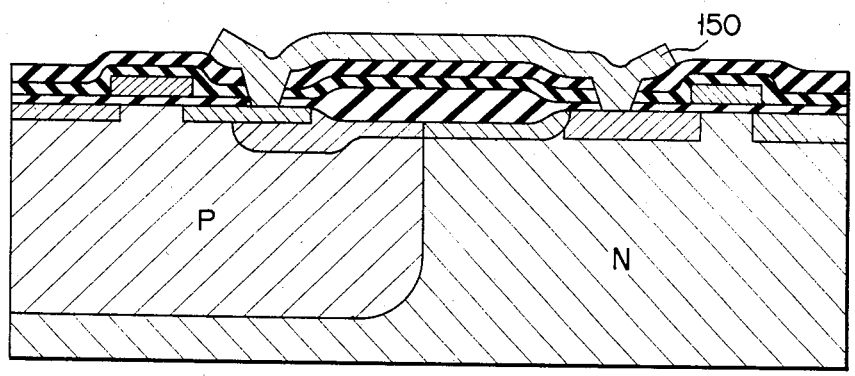

SEMICONDUCTOR DEVICE

This application is a continuation of application Ser. No. 324,631, filed Nov. 24, 1981.

BACKGROUND OF THE INVENTION

The present invention relates to a semiconductor device and more particularly to a semiconductor device of the CMOS (complementary metal oxide semiconductor) type.

In the field of the semiconductor, the CMOS type semiconductor device has predominantly been used in the light of low power dissipation and a high reliability. With this tendency, there has more intensively been demanded the improvement of density of integration by making the pattern finer. In the CMOS type semiconductor device, a P channel MOS transistor and a N channel MOS transistor must be fabricated into the same chip. This fabrication requirement hinders realization of a finer or more minute pattern. In fabricating this type semiconductor device, a well of P conductivity type is formed in a silicon substrate of N conductivity type, for example, for isolation purpose. In this case, a punch-through takes place through the boundary defined between the P well and the N substrate. To prevent the occurance of the punch-through, a sufficient breakdown voltage must be secured against the punch-through occuring in the vicinity of the boundary.

This problem will be discussed in detail referring to FIG. 1. In the CMOS device as shown in FIG. 1, the punch-through is likely to occur through the N+ region 16-P well 14-N substrate 12 as indicated by an arrow across a portion 20 of a boundary 18 defined between the N substrate 12 and the P well 14, which is located near the N+ region 16. The reason for this follows. Of the side face of the N+ region 16, a portion near a boundary part designated by 20 is covered with a P+ conductivity region 22. For this reason, no depletion layer is formed extending from the side face portion to the boundary part 20. However, a depletion layer grows from the entire bottom surface of the N+ region 16 into the P well 14, and easily connects to another depletion layer probably formed at the boundary part 20.

The obvious way to avoid such a phenomenon may be to sufficiently expand the distance between the N+ region 16 and the boundary 20. This approach, however, is in contradiction to the technical effort to make the pattern finer and to improve the integration density.

SUMMARY OF THE INVENTION

Accordingly, an object of the invention is to provide a semiconductor device in which the pattern is made finer and the integration density is improved, while securing a sufficient punch-through breakdown voltage.

According to the present invention, there is provided a semiconductor device comprising: a semiconductor substrate of a first conductivity type; a semiconductor well of a second conductivity type formed in said substrate; a first semiconductor region of the second conductivity type formed in said substrate, said first semiconductor region forming a source region or a drain region in a first MOS transistor of a first channel type; a second semiconductor region of the first conductivity type formed in said well, said second semiconductor region forming a source region or a drain region in a second MOS transistor of a second channel type; and a third semiconductor region for partially covering the peripheral and bottom surfaces of at least one of said first and second regions, which are in the proximity of a boundary defined between said substrate and said well, said third semiconductor being of the conductivity type opposite to that of at least one of said first and second regions, with an impurity concentration higher than that of said semiconductor area in which at least one of said regions is formed.

Figure 2:
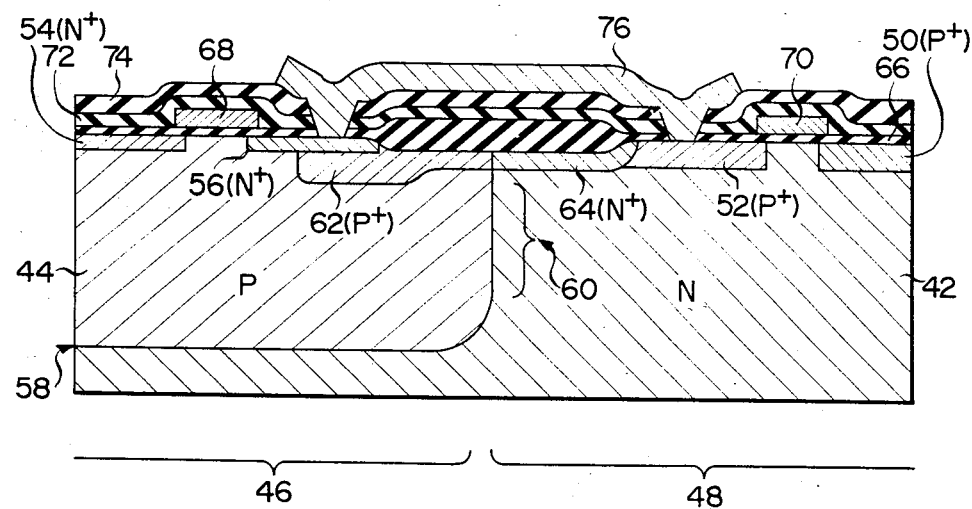
FIG. 2 is a cross-sectional view of an embodiment of a semiconductor device according to the present invention.
Figure 4:
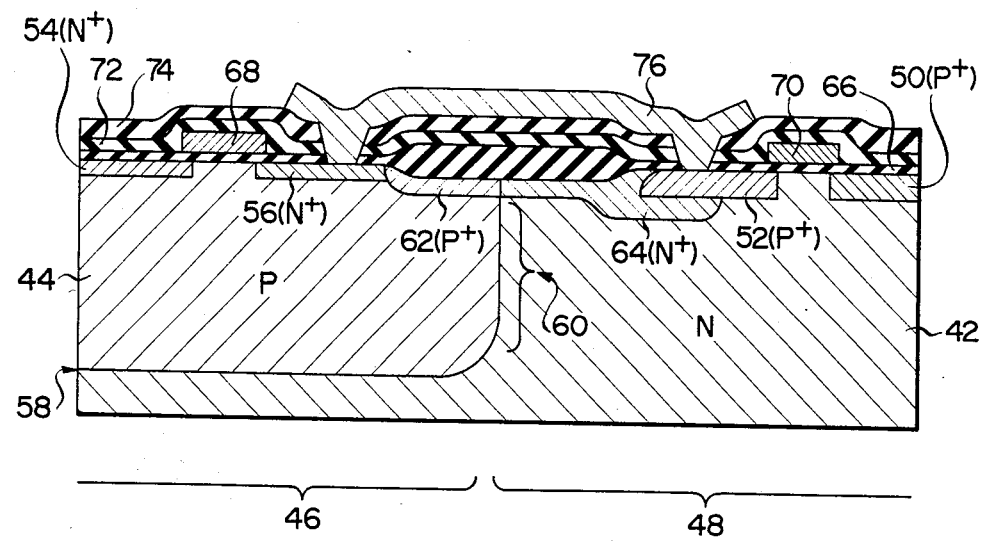
Figure 5:
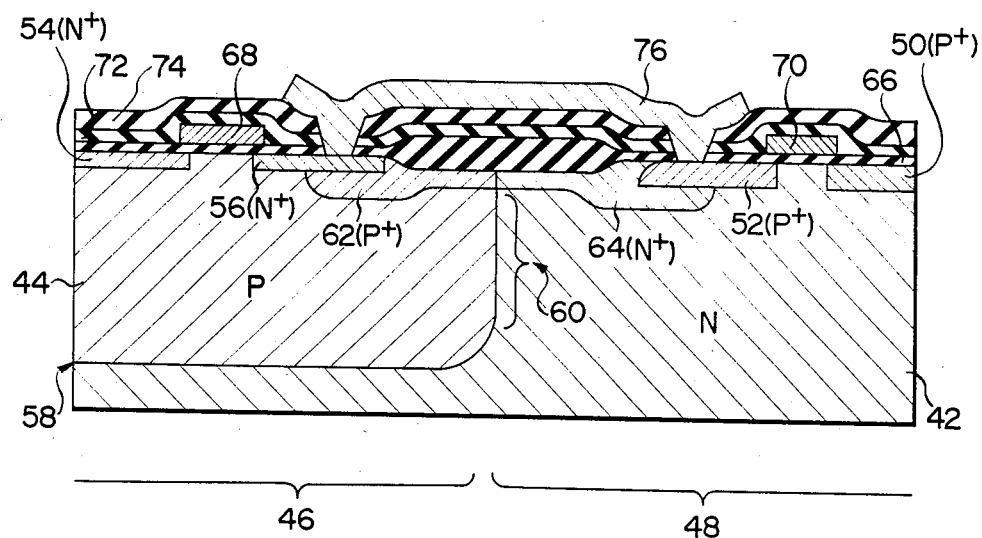

FIGSS. 3A to 3N and 3P to 3T are cross-sectional views illustrating a sequence of manufacturing process steps of the semiconductor device shown in FIG. 2;

FIG. 4 is a cross-sectional view of another embodiment of a semiconductor device according to the present invention; and FIG. 5 is a cross-sectional view of yet another embodiment of a semiconductor device according to the present invention.

DESCRIPTION OF THE PREFERRED EMBODIMEMTS

Embodiments of the present invention will be described referring to the accompanying drawings.

In a semiconductor device of CMOS type shown in FIG. 2, a P conductivity type well 44 is formed in a substrate 42 of N conductivity type. The P well region 44 serves as a separation region to electrically insulate an N channel MOS transistor 46 formed in the P well 44 from a P channel transistor 48 formed in the N type substrate 42. As shown, P+ conductivity type regions 50 and 52 to serve as a drain region and a source region, for example, of the P channel transistor 48 are formed in the N substrate 42, being separated from each other at a proper distance. N+ conductivity regions 54 and 56 to serve as a drain region and a source region, for example, are likewise formed in the P well 44, being separated from each other at a proper distance. Reference numeral 58 indicates a boundary defined between the N substrate 42 and the P well 44. Reference numeral 60 designates a part of the boundary 58 close to an N+ region 56. Also in the P well 44, a P+ conductivity region 62 is formed covering a partial side face and a partial bottom surface of the N+ region 56 while being in contact with those portions. An impurity concentration of the P+ region 62 is set to be higher than that of the P well. An impurity concentration of the P+ region 62 is set at $1 \times 10^{17}/cm^3$ to $5 \times 10^{17}/cm^3$, for example. An impurity concentration of the P well 44 is $6 \times 10^{15}/cm^3$ to $10 \times 10^{15}/cm^3$. Also in the N substrate 42, an N+ conductivity type region 64 is formed covering a partial side face of the P+ region 52 close to the partial boundary 60 while being in contact with this portion. An impurity concentration of the N+ region 64 is set at a higher value than that of the N substrate; for example, $1 \times 10^{17}/cm^3$ for the N+ region 64 and $1.5 \times 10^{15}/cm^3$ for the N substrate.

Over the major surface of the semiconductor body with such regions and the well, as insulation film 66 made of $SiO_2$, for example, is formed except contact hole sections above the P+ and N+ regions 52 and 56. A portion of the insulation film 62 located between the side edges of the N+ and P+ regions 56 and 52 is, for example, 1.0 μm, and thicker than the remaining portion of the insulation film 66.

A gate electrode 68 made of polycrystal silicon, for example, is formed above the channel region of the N channel transistor 46, through the insulation film 66. Similarly, a gate electrode 70 made of polycrystal silicon, for example, is formed above the channel region of the P channel transistor 48, through the insulation film 66. An insulation film 72 as an SiO$_2$ film, for example, is formed on the gate electrodes 68 and 70, and the insulation film 66. Another insulation layer 74 as a BPSG (boron and phospher silicate glass), for example, is further layered on the insulation layer 72. A single source electrode 76 made of silicon aluminum, for example, is formed on both the P+ region 52 and the N+ region 56 serving as the source regions, for example.

Figure 1:
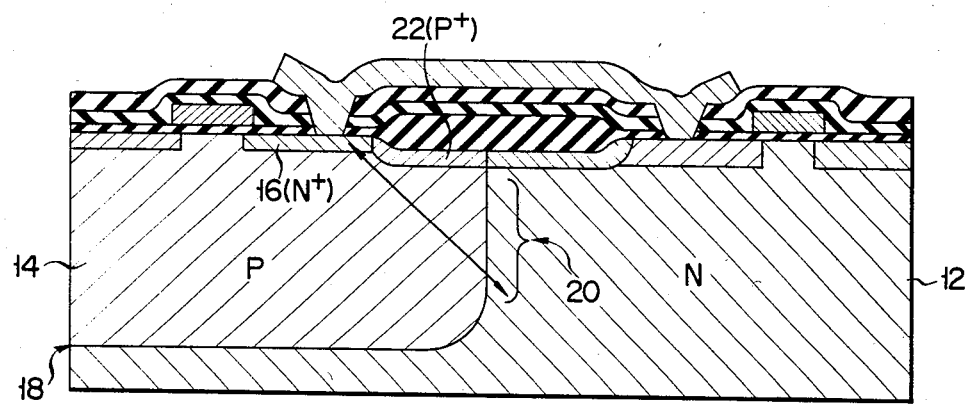
FIG. 1 is a cross-sectional view of a prior semiconductor device of the CMOS.

As described above, in the CMOS device, not only the side face of the N+ region 56 closer to the boundary part 60 but also the bottom surface of the same closer to the boundary part 60 is covered with the P+ region 62. This structure prevents the growth of a depletion layer from the side face of the N+ region 56 and the growth of a depletion layer from the bottom surface closer to the boundary portion 60 as well. Therefore, any depletion layer extending from the N+ region 56 is kept away from the depletion layer extending from the boundary portion 60, almost eliminating the possibility of the interconnection of those depletion layers. Therefore, no punch-through takes place even if the distance between the N+ region 56 and the boundary portion 60 is set to such a value which would surely cause the punch-through to occur through the N+ region 56-P well 44-n substrate 42, as indicated by the arrow shown in FIG. 1, when the bottom portion of the N+ region 56 close to the boundary 60 is not covered with the P+ region 62.

As seen from the foregoing description, the above-mentioned embodiment enables the pattern of the semiconductor device to be made finer thereby to attain the improvement of the integration density. Further, it allows an increase of the breakdown voltage against the punch-through taking place through the N+ region 56-P well 44-N substrate 42.

As recalled, the portion covered with the P+ region 62 is not the entire surface of the N+ region 56 but the partial side face and the partial bottom surface of the N+ region 56, which are closer to the boundary portion 60. This feature suppresses an extreme increase of a diffusion capacitance coupled with the N+ region 56, so that the adverse effect by the diffusion capacitance increase on a high speed operation of the semiconductor device is not so much.

Figure 3A:
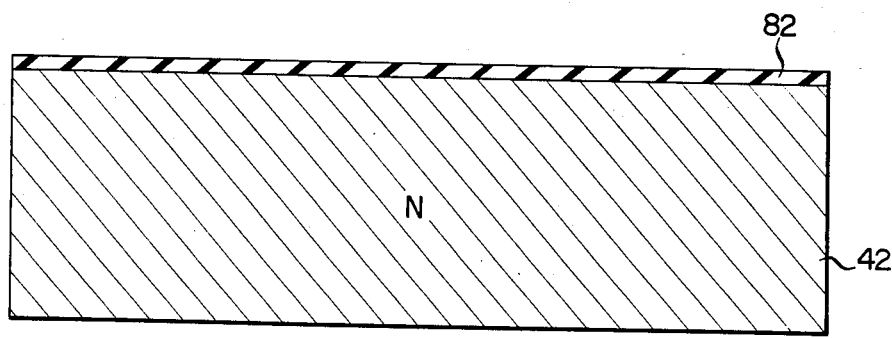

An example of a manufacturing method of the CMOS device shown in FIG. 2 will be described referring to FIGS. 3A to 3T.

To start, a substrate 42 of N type conductivity which has the crystal structure (100) and of which the impurity concentration is $1.5 \times 10^{15}$/cm$^3$ is prepared. A SiO$_2$ film 82 with the thickness of 1700±300 Å, for example, is formed on the major surface of the substrate 42 by the thermal oxidation technique, for example (FIG. 3A).

Figure 3B:
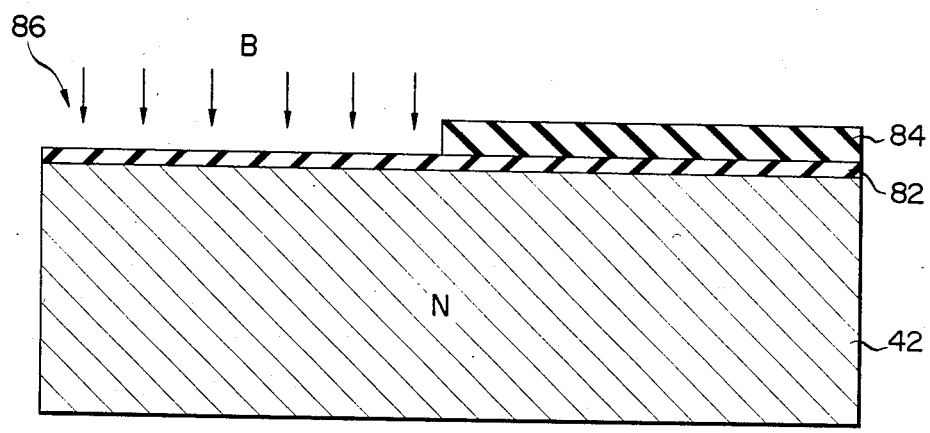

After photoresist 84 is coated over the SiO$_2$ film 82, the photoresist portion corresponding to the N substrate 44 in which the N channel transistor 46 (FIG. 2) is formed is etched away by the photo etching process (referred to as PEP), thereby to leave a photoresist film only above the area in which the P channel transistor 48 is to be formed (FIG. 3B).

In the next step, through an opening 86 formed at the etched away portion, boron, for example, is implanted at dosage of $1.0 \times 10^{13}$/cm$^2$ and at an acceleration voltage of 100 KeV, by the ion implantation technique (FIG. 3B).

Figure 3C:
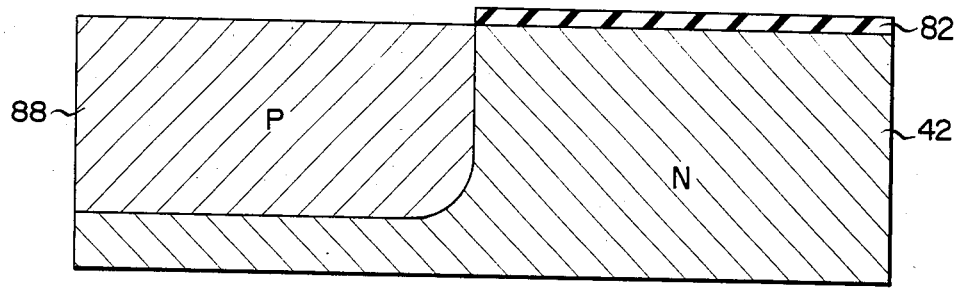

Following this, with a mask of the photoresist film 84, the SiO$_2$ film 82 corresponding to the N substrate 42, in which the N channel transistor 46 is to be formed, is removed by the PEP using ammonium fluoride. Then, the balance of the photoresist film 84 is also removed by the PEP. The resultant structure is then placed in a nitrogen atmosphere containing 4 to 8% oxygen, and heated at 1200° C. for 30 minutes, for example, to diffuse the boron previously injected by ion implantation, thereby to form a P well 88 in the N substrate 42 (FIG. 3C).

Figure 3D:
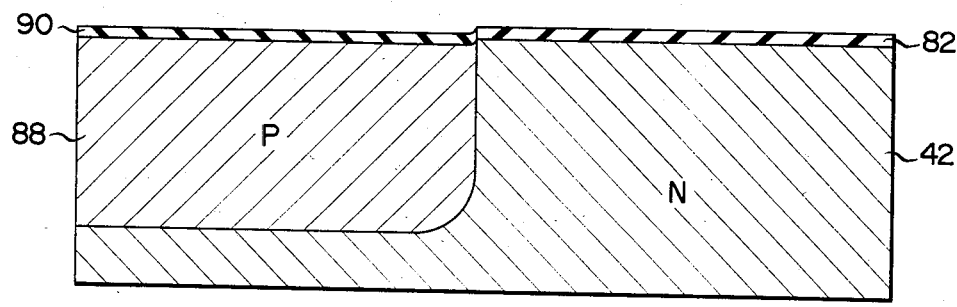

In the heating process, a SiO$_2$ film 90 is formed on the N substrate 42 portion (the region of the P well 88) in which the N channel transistor 46 is to be formed (FIG. 3D). The SiO$_2$ film 90 is stepped down from the SiO$_2$ film 82 toward the N substrate 42. This step is used for a mark when a masking step to follow is executed. The step is omitted for simplification of the illustration of the drawings.

Figure 3E:
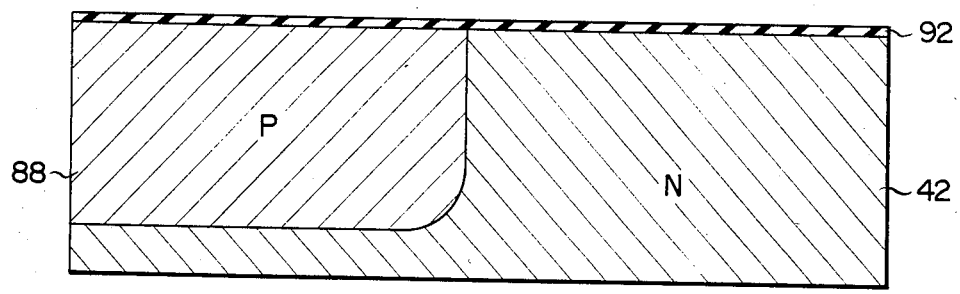

The SiO$_2$ films 82 and 90 are removed by hydrofluoric acid, and an SiO$_2$ film 92, 1000±100 Å, for example, in thickness, is formed on the major surface of the substrate 42 containing the P well 88 (FIG. 3E.)

Figure 3F:
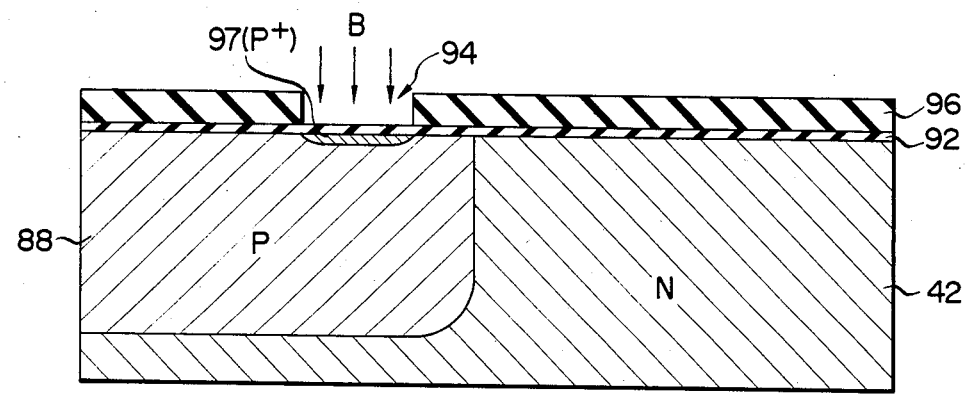

In the succeeding step, a photoresist film 96 with an opening 94, which serves as a gate region of the N substrate 42 (the P well 88) in which the N channel transistor 46 is to be formed, is formed over SiO$_2$ film 92 (FIG. 3F). After this, boron, for example, is implanted into the P well 88 through the opening 94 at the dosage of $3 \times 10^{14}$/cm$^2$, for example, and 40 KeV of the acceleration voltage, thereby to form a P+ conductivity region 97 (FIG. 3F).

Figure 3G:
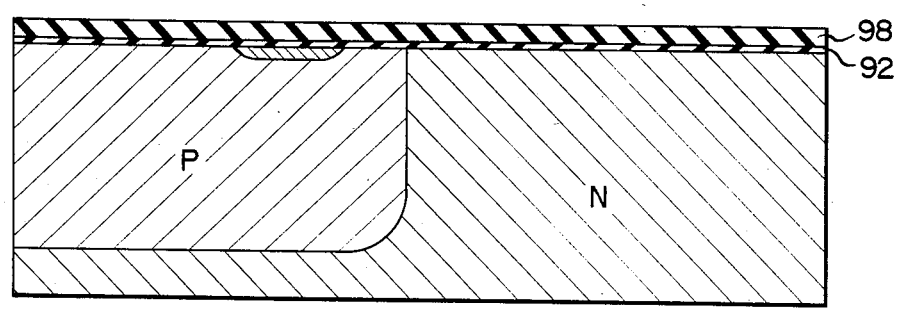

After the step of FIG. 3F, the photoresist film 96 is removed and an Si$_3$N$_4$ film 98 of 3000±300 Å, for example, in thickness is formed on the SiO$_2$ film 92 (FIG. 3G).

Figure 3H:
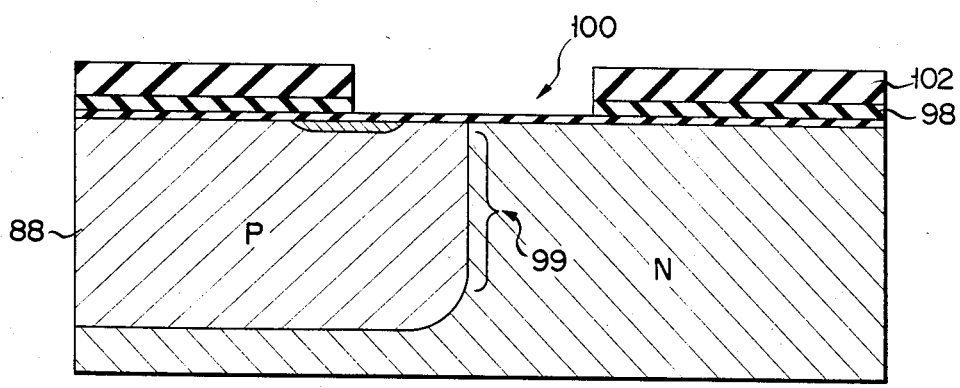

The next step provides the formation of a photoresist film 102 with an opening 100 containing a portion corresponding to a part 99 of a boundary defined between the P well 88 and the N substrate 42 (FIG. 3H) on the Si$_3$N$_4$ film 98. In the same step, a given portion of the Si$_3$N$_4$ film 98 is removed by the plasma etching technique, using the mask of the photoresist film 102 (FIG. 3H).

Figure 3I:
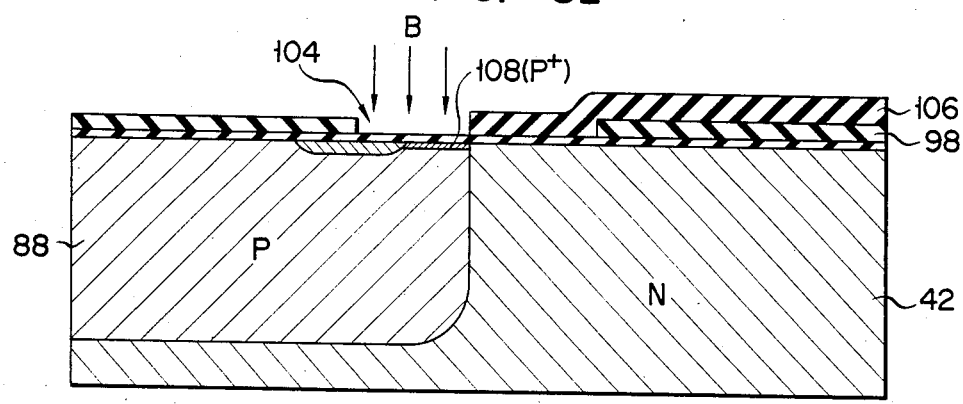

After removing the photoresist film 102, a photoresist film 106 is formed with an opening 104 formed at a location on the structure surface above the N substrate 42 (P well) in which the N channel transistor 46 is to be formed (FIG. 3I). Then, boron, for example, is implanted into the P well 88 through the opening 104, at the dosage of $8.0 \times 10^{13}$/cm$^2$, for example, and 40 KeV of the acceleration voltage, to thereby form a P+ conductivity region 108 for preventing the inversion of a parasitic MOS in the N channel transistor 46 (FIG. 3I). The impurity concentration of the P+ region 108 is less than the impurity concentration of the P+ region 97.

Figure 3J:
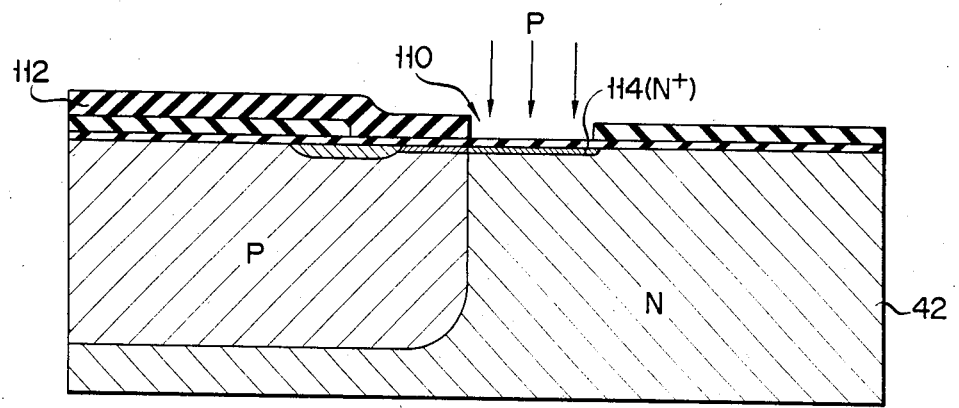

After the photoresist film 106 is removed, a photoresist film 112 with an opening 110 is formed on the structure surface above the P well by the photoresist coating and PEP processes. The opening 110 is formed at the structure surface portion corresponding to the N substrate 42 in which the P channel transistor 48 to be is formed (FIG. 3J). Then, through the opening 110, phosphorus, for example, is implanted into the N substrate 42 at 100 KeV of the acceleration voltage and $4.0 \times 10^{12}$/cm$^2$ of the dosage by the ion implantation technique, thereby to form an N+ conductivity region 114 (FIG. 3J).

Figure 3K:
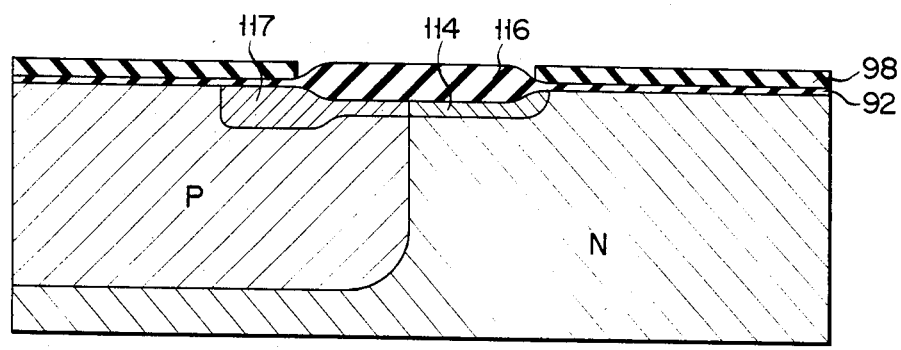

After the photoresist film 112 is removed, the resultant structure is placed in a vapor atmosphere of 1000° C., for example, and subjected to a heat treatment. Through this heat treatment, a SiO$_2$ film 116 of 1.0 μm in thickness is formed on the surface of the resultant structure where there is no Si$_3$N$_4$ film 98 (FIG. 3K). In the heat treatment, the boron in the P+ regions 97 and 108 (together indicated as numeral 117) implanted with boron and the N+ region 114 implanted with phosphorus are diffused (FIG. 3K). In this case, the region of the P+ region 117, which corresponds to the former P+ region 97, is deeper than an N+ source region or the N+ regions 136 and 138 to be formed later (FIG. 3K). Also in the heat treatment process, a SiO$_2$ film (not shown) is formed on the Si$_3$N$_4$ film 98, although the SiO$_2$ film is slight. Accordingly, in the next step, by using ammonium fluoride, for example, the SiO$_2$ film on the Si$_3$N$_4$ film 98 is removed by etching the resultant structure for about 30 seconds by the PEP.

Figure 3L:
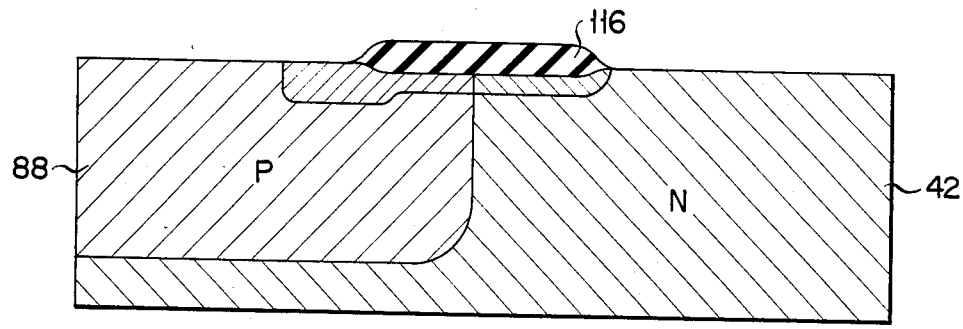

And then the Si$_3$N$_4$ film 98 is removed by the PEP. Subsequently, by using ammonium fluoride, the SiO$_2$ film 92 is removed through the PEP process, so that an SiO$_2$ film 116 of about 1.0 μm in thickness is left on the surface of the semiconductor structure except that portion where the source, drain and gate regions of the N channel transistor 46 and the P channel transistor 48 (FIG. 2) are to be formed (FIG. 3L). An SiO$_2$ film (not shown) with the thickness of 600 Å or so, for example, is formed on the surface of the resultant structure. After this, the SiO$_2$ film is removed by the PEP using ammonium fluoride, to remove nitride appearing on the surface of the substrate from the Si$_3$N$_4$ film 98 by the heat treatment when the SiO$_2$ film 116 is formed.

Figure 3M:
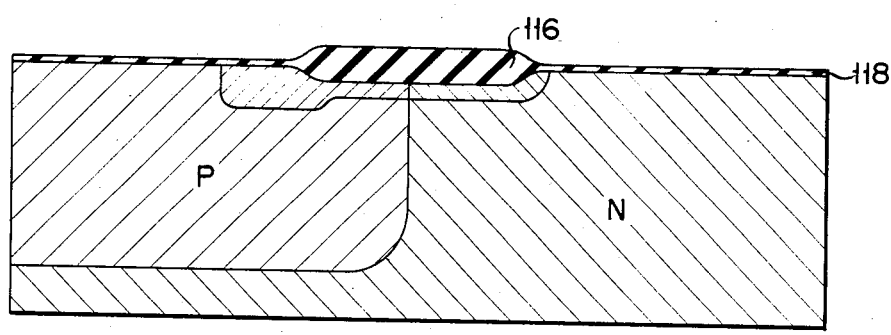

At a temperature of 1000° C., the resultant structure is oxidized using acidechlorhydrique, thus forming a gate insulation SiO$_2$ film 118 of 800 Å, for example (FIG. 3M).

Figure 3N:
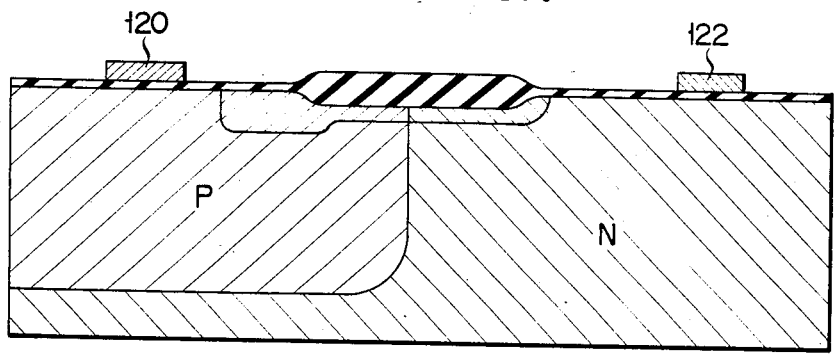

In the following process, a polycrystal silicon layer (not shown) of 4000 Å in thickness, for example, is formed on the film 116 and 118. Phosphorus is then diffused into the polycrystal silicon layer to form an N+ layer (not shown). Photoresist is then coated over the N+ layer by the PEP and the N+ layer is selectively removed by the PEP, while the N channel transistor 46, and the gate electrodes 120 and 122 of the P channel transistor 46 and the P channel transistor 48 are left (FIG. 3N).

The succeeding step forms a photoresist film 126 with an opening 124 on the structure surface. The opening 124 is located at the position corresponding to the substrate 42 in which the P channel transistor 48 is formed (FIG. 3P). Through the opening 124, boron, for example, is implanted into a P+ regions 128 and 130 serving as the source region and the drain region (FIG. 3P).

After removing the photoresist film 126, a photoresist film 134 with an opening 132 formed at the location corresponding to the P well 88 in which the N channel transistor is to be formed is formed in the surface of the structure (FIG. 3Q). Arsenic is ion-implanted through the opening 132, to form N+ regions 136 and 138 serving as the source and drain regions (FIG. 3Q).

A step is executed for forming an oxidation film 140 of 4000 Å, for example, in thickness through the CVD technique (FIG. 3R). The oxidation film 140 is etched by ammonium fluoride, for example, for about 30 seconds to remove the fluoride with a high concentration residing on the surface of the oxidation film 140. After the removal of the phosphorus, a PBSG film 142 of 5000 Å, for example, in thickness is formed on the oxidation film 140 by the CVD technique (FIG. 3R). In order to prevent a metal layer formed on the BPSG film 142 from being stepwise broken, in the subsequent step, for example, the BPSG film 142 is heated for about 20 minutes in a nitrogen atmosphere at 1000° C.

Then, a photoresist film 144 with an opening, which is located at the portion corresponding to the N+ region 136 of the N channel transistor 46 and the P+ region 128 of the P channel transistor 48, if formed, and with the mask, the insulation film 140 and the BPSG 142 are selectively removed by the PEP, to form contact holes 146 and 148 (FIG. 3S).

Finally, a silicon aluminum layer 150, for example, is vapor-deposited on the surface of the structure, and portions selectively removed to form a the electrode interconnection layer 76 (FIG. 3T) interconnecting the source regions. In this way, the CMOS device shown in FIG. 2 is formed.

In the embodiment of FIG. 2 the P+ region 62 extends into the N channel transistor 46 from the side of the N+ 56 across a portion of the bottom thereof, thus preventing the forming of a depletion layer. Instead, a semiconductor region may be provided in the P channel transistor 48 in order to prevent forming of a depletion layer. Obviously the semiconductor region should have N+ conductivity type.

FIG. 4 shows an embodiment wherein an N+ region 64 is provided in a P channel transistor 48, thus preventing the forming of a depletion layer. The N+ region 64 partly covers those portions of the periphery and bottom of a source P+ region 52 which are in the proximity of a boundary portion 60. Since the N+ region 64 is so provided as to prevent punch-through of P+ region 52-N substrate 42-P well 44, thus making the pattern finer.

FIG. 5 shows a further embodiment of the invention, in which a P+ region 62 and an N+ region 64 are provided in an N channel transistor 46 and a P channel transistor 48, respectively. With this embodiment it is possible to prevent both punch-through of N+ region 56-P well 44-N substrate 42 and punch-through of P+ region 52-N substrate 42-P well 44. Further it is possible to reduce the distance between the N+ region 56 and a boundary portion 60 and the distance between the P+ region 52 and the boundary portion 60. Therefore, the pattern can be made more fine than in the embodiments of FIGS. 2 and 4.

In the embodiments of FIGS. 2, 4 and 5 a semiconductor substrate of N conductivity type is used a well of P conductivity type is formed in the substrate. Instead, a semiconductor substrate of P conductivity type may be used and a well of N conductivity type may be formed in the substrate.

This invention is not limited to the above-mentioned embodiments. Various modifications are possible within the scope of the invention.

What is claimed is:

1. A semiconductor device comprising:
   a semiconductor substrate of a first conductivity type;

a semiconductor well of a second conductivity type formed in said semiconductor substrate, boundary formed between said well and substrate, the boundary having a bottom substantially parallel to a major surface of said substrate and a side substantially perpendicular to said major surface;

a first semiconductor region of said first conductivity type formed in said well, the first semiconductor region forming a source region or a drain region of a MOS transistor; and a second semiconductor region formed in said well, the second semiconductor region having said second conductivity type with a higher impurity concentration than that of said well, a portion of said second semiconductor region partially covering said side and bottom of said first semiconductor region, and the depth of the portion of the second semiconductor region covering the side and bottom of said first semiconductor region being greater than the depth of the remainder of said second semiconductor region.

2. A semiconductor device according to claim 1 wherein the length of that part of the bottom of the first semiconductor region covered with said second semiconductor region is larger than the depth of the portion of said second semiconductor region covering said first semiconductor region.

* * * * *